United States Patent
Huang et al.

(10) Patent No.: US 10,917,964 B2
(45) Date of Patent: Feb. 9, 2021

(54) PRIMER COMPOSITION AND COPPER FOIL SUBSTRATE USING THE SAME

(71) Applicant: Industrial Technology Research Institute, Hsinchu (TW)

(72) Inventors: Shi-Ing Huang, Miaoli County (TW); Jui-Hsiang Tang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 148 days.

(21) Appl. No.: 16/057,779

(22) Filed: Aug. 7, 2018

(65) Prior Publication Data

US 2019/0053367 A1    Feb. 14, 2019

Related U.S. Application Data

(60) Provisional application No. 62/543,393, filed on Aug. 10, 2017.

(30) Foreign Application Priority Data

Apr. 17, 2018 (TW) .............................. 107113094 A

(51) Int. Cl.
*H05K 1/02* (2006.01)
*B32B 15/085* (2006.01)
(Continued)

(52) U.S. Cl.
CPC ........... *H05K 1/024* (2013.01); *B32B 15/085* (2013.01); *B32B 15/20* (2013.01); *B32B 27/322* (2013.01); *C08G 77/20* (2013.01); *C08J 7/042* (2013.01); *C08J 7/0427* (2020.01); *C09D 4/06* (2013.01); *C09D 5/002* (2013.01); *C09D 7/65* (2018.01); *C09D 147/00* (2013.01); *C09D 171/12* (2013.01); *C09D 183/04* (2013.01); *C09D 183/06* (2013.01); *H05K 1/09* (2013.01);
(Continued)

(58) Field of Classification Search
CPC ...................................................... H05K 1/024
See application file for complete search history.

(56) References Cited

U.S. PATENT DOCUMENTS

| | | | |
|---|---|---|---|
| 3,959,198 A | 5/1976 | Broecker et al. | |
| 4,721,750 A * | 1/1988 | Nakamura | C09D 143/04 524/315 |

(Continued)

FOREIGN PATENT DOCUMENTS

| | | |
|---|---|---|
| CN | 101643565 | 2/2010 |
| CN | 101283414 | 9/2011 |

(Continued)

OTHER PUBLICATIONS

"Office Action of Taiwan Counterpart Application," dated Feb. 20, 2020, p. 1-p. 4.

(Continued)

*Primary Examiner* — Ramsey Zacharia
(74) *Attorney, Agent, or Firm* — JCIPRNET

(57) ABSTRACT

A primer composition and a copper foil substrate using the same are provided. The primer composition includes a mixture of a hydrocarbon resin and a compound having three or more carbon-carbon double bonds, wherein a molar ratio of the hydrocarbon resin to the compound having three or more carbon-carbon double bonds is 1:0.2 to 1:10.

11 Claims, 1 Drawing Sheet

US 10,917,964 B2
Page 2

(51) Int. Cl.
| | |
|---|---|
| *B32B 15/20* | (2006.01) |
| *C09D 4/06* | (2006.01) |
| *C09D 147/00* | (2006.01) |
| *C09D 171/12* | (2006.01) |
| *H05K 3/02* | (2006.01) |
| *B32B 27/32* | (2006.01) |
| *C09D 5/00* | (2006.01) |
| *C09D 183/04* | (2006.01) |
| *C08J 7/04* | (2020.01) |
| *H05K 1/09* | (2006.01) |
| *C09D 7/65* | (2018.01) |
| *C08G 77/20* | (2006.01) |
| *C09D 183/06* | (2006.01) |
| *C08J 5/24* | (2006.01) |

(52) U.S. Cl.
CPC .......... *H05K 3/022* (2013.01); *B32B 2255/06* (2013.01); *B32B 2255/10* (2013.01); *B32B 2255/24* (2013.01); *B32B 2255/26* (2013.01); *B32B 2307/204* (2013.01); *B32B 2457/08* (2013.01); *C08J 5/24* (2013.01); *C08J 2327/18* (2013.01); *C08J 2409/00* (2013.01); *C08J 2447/00* (2013.01); *C08J 2471/12* (2013.01); *C08J 2483/07* (2013.01); *H05K 2201/015* (2013.01); *H05K 2201/0158* (2013.01); *H05K 2201/0355* (2013.01)

(56) References Cited

U.S. PATENT DOCUMENTS

| | | | |
|---|---|---|---|
| 4,824,511 | A | 4/1989 | Hartman et al. |
| 5,046,238 | A | 9/1991 | Daigle et al. |
| 5,352,531 | A | 10/1994 | Roberts et al. |
| 5,792,375 | A | 8/1998 | Farquhar |
| 6,057,414 | A | 5/2000 | Razavi |
| 6,506,314 | B1 | 1/2003 | Whitney, Jr. et al. |
| 6,861,092 | B2 | 3/2005 | McCarthy et al. |
| 8,507,791 | B2 | 8/2013 | Suzuta et al. |
| 9,055,700 | B2 | 6/2015 | Humphries et al. |
| 2005/0069722 | A1 | 3/2005 | McCarthy et al. |
| 2014/0044918 | A1 | 2/2014 | Zeng |
| 2014/0216532 | A1 | 8/2014 | Kim et al. |
| 2016/0148719 | A1* | 5/2016 | Yin .................. H01B 3/427 524/119 |
| 2016/0177082 | A1* | 6/2016 | Liao .................. C08J 5/24 428/457 |
| 2016/0249451 | A1 | 8/2016 | Das et al. |
| 2016/0362527 | A1 | 12/2016 | Koes |
| 2017/0120561 | A1 | 5/2017 | Huang et al. |

FOREIGN PATENT DOCUMENTS

| | | |
|---|---|---|
| CN | 101039553 | 7/2012 |
| CN | 104742438 | 7/2015 |
| CN | 106191939 | 12/2016 |
| CN | 106626580 | 5/2017 |
| TW | 201524760 | 7/2015 |
| TW | I491508 | 7/2015 |
| TW | 201538532 | 10/2015 |
| TW | I527685 | 4/2016 |
| TW | 201623440 | 7/2016 |
| TW | 201637527 | 10/2016 |
| TW | I564145 | 1/2017 |
| TW | 201714738 | 5/2017 |
| TW | I584946 | 6/2017 |
| TW | I607866 | 12/2017 |

OTHER PUBLICATIONS

J. P. Badey, et al., "Influence of chemical and plasma treatments on the adhesive properties of PTFE with an epoxy resin," International Journal of Adhesion and Adhesives, vol. 16, Issue 3, 1996, pp. 173-178.

Z. H. Ma, et al., "Surface graft copolymerization induced adhesion of polyaniline film to polytetrafluoroethylene film and copper foil," European Polymer Journal, vol. 35, Jul. 1998, pp. 1279-1288.

Chen-Yuan Tu, et al., "Surface grafting polymerization and modification on poly(tetrafluoroethylene) films by means of ozone treatment," Polymer, vol. 46, Jul. 2005, pp. 6976-6985.

Sikuai Xue, et al., "A catechol-based biomimetic strategy combined with surface mineralization to enhance hydrophilicity and antifouling property of PTFE flat membrane," Journal of Membrane Science, vol. 524, Nov. 2016, pp. 409-418.

M. C. Zhang, et al., "Surface modification of aluminum foil and PTFE film by graft polymerization for adhesion enhancement," Colloids and Surfaces A: Physicochemical and Engineering Aspects, vol. 176, Jun. 2000, pp. 139-150.

"Office Action of China Counterpart Application", dated Apr. 7, 2020, p. 1-p. 7.

* cited by examiner

PRIMER COMPOSITION AND COPPER FOIL SUBSTRATE USING THE SAME

CROSS-REFERENCE TO RELATED APPLICATION

This application claims the priority benefit of U.S. provisional application Ser. No. 62/543,393, filed on Aug. 10, 2017 and Taiwan application no. 107113094, filed on Apr. 17, 2018. The entirety of each of the above-mentioned patent applications is hereby incorporated by reference herein and made a part of this specification.

TECHNICAL FIELD

The disclosure relates to a primer composition and a copper foil substrate using the same.

BACKGROUND

The need to new-generation electronic products includes light and small, even high-frequency transmission capability. Therefore, the wiring density of the circuit board becomes higher, and the material selection of the circuit board must be more demanding. To maintain the transmission rate and to reduce loss in signal transmission, the printed circuit board installed in the electronic apparatus is desired to have low dielectric loss and low dielectric constant. Moreover, the transmission quality provided by a material having smaller dielectric loss is also better.

Therefore, the development of a substrate having low dielectric constant and low dielectric loss is an important topic in the relevant art at this stage. The application of this substrate in the manufacture of a high frequency circuit board is also an important topic in the relevant art at this stage.

SUMMARY

The disclosure provides a primer composition including a mixture of a hydrocarbon resin and a compound having three or more carbon-carbon double bonds, wherein a molar ratio of the hydrocarbon resin to the compound having three or more carbon-carbon double bonds is 1:0.2 to 1:10.

The disclosure further provides a copper foil substrate including copper foil, a fluorinated polymer layer, a silane layer, and a primer layer. The fluorinated polymer layer is disposed on a surface of the copper foil, and the silane layer is disposed between the fluorinated polymer layer and the surface of the copper foil. The primer layer is disposed between the fluorinated polymer layer and the silane layer, wherein the primer layer includes the above-mentioned primer composition.

In accordance with another embodiment of the disclosure, a copper foil substrate is provided. The copper foil includes a first copper foil, a second copper foil, a first silane layer, a second silane layer, a fluorinated polymer layer, a first primer layer, and a second primer layer. The fluorinated polymer layer is disposed between the first copper foil and the second copper foil. The first silane layer is disposed between the fluorinated polymer layer and the first copper foil. The first primer layer is disposed between the fluorinated polymer layer and the first silane layer. The second silane layer is disposed between the fluorinated polymer layer and the second copper foil. The second primer layer is disposed between the fluorinated polymer layer and the second silane layer, wherein the first primer layer and the second primer layer include the above-mentioned primer composition.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Hereinafter, embodiments of the disclosure are described in detail. The details provided in the embodiments are exemplary, and are not intended to limit the scope of the disclosure. Those having ordinary skill in the art can modify or change the details according to the requirements of actual implementation. For instance, for clarity, the relative thickness and location of film layers, regions, and/or structural elements may be reduced or enlarged.

Figure 1:
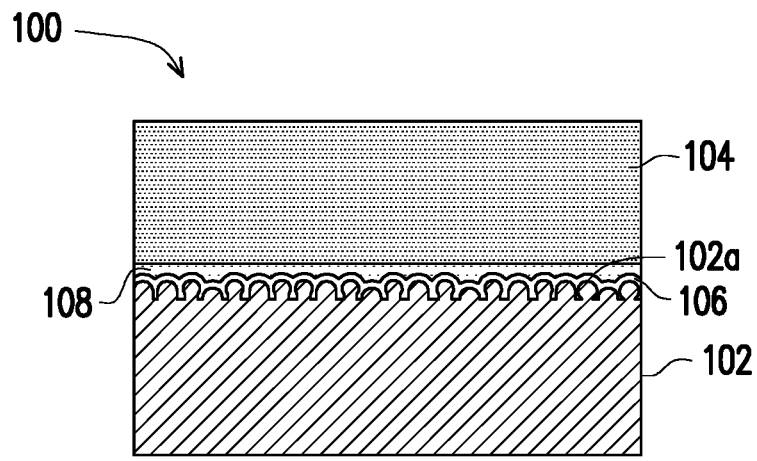
FIG. 1 is a schematic cross-sectional view of a copper foil substrate for high-frequency communication according to an exemplary embodiment of the disclosure.

FIG. 1 is a schematic cross-sectional view of a copper foil substrate for high-frequency communication according to an exemplary embodiment of the disclosure.

With reference to FIG. 1, a copper foil substrate 100 for high-frequency communication provided by the disclosure may include a copper foil 102, a fluorinated polymer layer 104, a silane layer 106, and a primer layer 108. The fluorinated polymer layer 104 is disposed on a surface 102a of the copper foil 102. The surface 102a of the copper foil 102 has a ten-point mean roughness (Rz) of 2 μm or less and a root-mean-square roughness (Rq) of 0.5 μm or less, and the surface 102a preferably has a Rz of 1 μm or less. The copper foil 102 used in the present embodiment can be refined or milled copper foil, and can also be electrodeposited copper foil. The general electrodeposited copper foil has a shiny surface and a rough surface, and the surface 102a formed by the silane layer 106 of the present embodiment can the shiny surface or the rough surface of the copper foil 102.

In this embodiment, the silane layer 106 is disposed between the fluorinated polymer layer 104 and the surface 102a of the copper foil 102, wherein the silane layer 106 may be silane containing carbon-carbon double bonds. According to an embodiment of the disclosure, the silane containing carbon-carbon double bonds can have a structure of chemical formula $R_1$—$Si(OR_2)_3$, wherein $R_1$ is $C_2$ to $C_8$ alkenyl, $R_2$ is $C_1$ to $C_8$ alkyl. In one example, $R_1$ can be vinyl or allyl, and $R_2$ can be $CH_3$ or $C_2H_5$, so the silane containing carbon-carbon double bonds includes, for instance, 3-(trimethoxysilyl)propyl methacrylate, triethoxyvinylsilane, or a combination thereof. In this embodiment, the silane compound alone or mixed with suitable solvent can be coated on the surface 102a of the copper foil 102. In general, the silane compound is dispersed in the suitable solvent and then coated on the surface 102a of the copper foil 102 via reverse roll coating, blade coating, dip coating, or a stencil method to form a wet film. Then, a one-stage baking process is performed, such as baking at 130° C. for 5-15 minutes.

In this embodiment, the primer layer 108 is disposed between the fluorinated polymer layer 104 and the silane layer 106, wherein a thickness of the primer layer 108 is, for example, less than 2.5 µm. The primer layer 108 includes a primer composition, and the primer composition is a mixture of a hydrocarbon resin and a compound having three or more carbon-carbon double bonds. For instance, the hydrocarbon resin in the primer layer 108 may be a polymer containing carbon-carbon double bonds, such as polybutadiene, polyphenylene ether, or a combination thereof, wherein a weight average molecular weight of the polybutadiene is, for example, between 1,000 and 8,500. The compound having three or more carbon-carbon double bonds in the primer layer 108 includes, for example, trimethallyl isocyanurate (TMAIC), methylvinyl cyclosiloxane, tetramethyl tetravinyl cyclotetrasiloxane, pentamethylpentavinyl cyclopentasiloxane, octavinylocta silasesquioxane, or a combination thereof.

A thickness of the fluorinated polymer layer 104 is, for example, less than 1 mm, and the fluorinated polymer layer 104 is, for example, includes polytetrafluoroethylene (PTFE), fluorinated ethylene propylene (FEP), soluble polyfluoroalkoxy (PFA), or tetrachloroethylene/perfluoromethyl vinyl ether (MFA). In this embodiment, surface modification may be performed on the fluorinated polymer layer 104 through a sodium etching method, for example. Then, a material of the primer layer 108 is coated on a surface of the fluorinated polymer layer 104, and the material of the primer layer 108 is generally dispersed in a suitable solvent such as a ketone solvent and then coated on the fluorinated polymer layer 104 using reverse roll coating, blade coating, dip coating, or a stencil method to form a wet film. A one-stage baking process is performed afterwards, such as baking at 160° C. for 3 minutes to a B-stage. Next, pressing is performed at, for example, 180° C., as such, the silane layer 106 and the primer layer 108 are bonded face-to-face, and the respective foregoing layers are cured at the same time.

Figure 2:
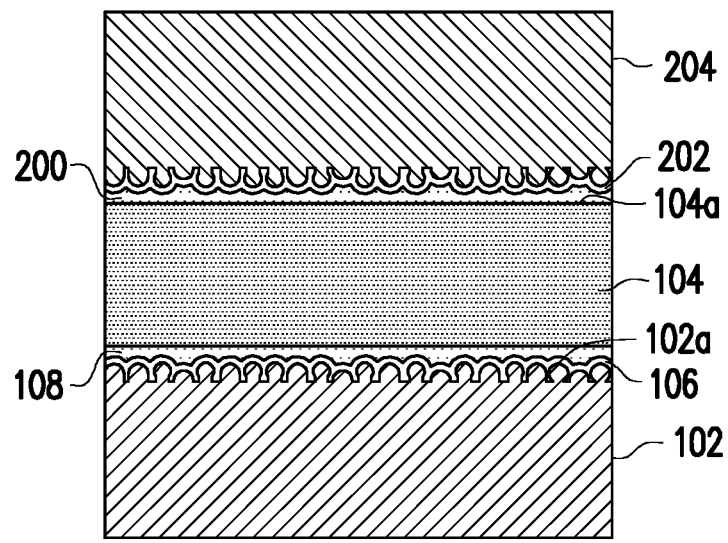
FIG. 2 is a schematic cross-sectional view of a structure of the copper foil substrate of FIG. 1 after built-up.

FIG. 2 is a schematic cross-sectional view of a structure of the copper foil substrate of FIG. 1 after built-up, wherein the reference numerals identical to that of FIG. 1 are used to represent identical or similar components.

With reference to FIG. 2, if a built-up process is to be performed on the copper foil substrate of FIG. 1, another primer layer 200 can be coated on the other surface 104a of the fluorinated polymer layer 104 not being stacked with copper foil 102. In general, a material of the primer layer 200 is dispersed in a suitable solvent, such as a ketone solvent, and then coated on the surface 104a of the fluorinated polymer layer 104 via reverse roll coating, blade coating, dip coating, or a stencil method to form a wet film. A one-stage baking process is performed afterwards, such as baking at 160° C. for 3 minutes. Next, a copper foil 204 with a silane layer 202 is stacked to perform thermal pressing, as such, the silane layer 202 and the primer layer 200 are bonded face-to-face, and the respective foregoing layers are cured at the same time. A detailed composition of the primer layer 200 may be referenced to the primer layer 108, and a detailed composition of the silane layer 202 may be referenced to the silane layer 106, and thus no further explanation is provided hereinafter. In this embodiment, the silane compound alone or mixed with a with a suitable solvent can be coated on the surface of the copper foil 204. In general, the silane compound is dispersed in the suitable solvent and then coated on the copper foil 204 via reverse roll coating, blade coating, dip coating, or a stencil method to form a wet film. Then, a one-stage baking process is performed, such as baking at 130° C. for 5-15 minutes to form the silane layer 202.

In the disclosure, since specific primer composition is used, the adhesion between the copper foil and the fluorinated polymer layer are enhanced while the electrical performance of the copper foil structure may be maintained.

In an embodiment of the disclosure, the primer composition includes a mixture of a hydrocarbon resin and a compound having three or more carbon-carbon double bonds, wherein a molar ratio of the hydrocarbon resin to the compound having three or more carbon-carbon double bonds is 1:0.2 to 1:10. The hydrocarbon resin may be a compound containing carbon-carbon double bonds, such as polybutadiene, polyphenylene ether, or a combination thereof, wherein a weight average molecular weight of the polybutadiene is, for example, between 1,000 and 8,500. The compound having three or more carbon-carbon double bonds includes, for example, tetramethyl tetravinyl cyclotetrasiloxane (TMAIC), methylvinyl cyclosiloxane, tetramethyl tetravinyl cyclotetraoxime (TMTVCS), pentamethylpentavinyl cyclopentasiloxane, octavinylocta silasesquioxane, or a combination thereof. In this embodiment, the primer composition may further include a ketone solvent and an initiator. Among them, the ketone solvent is, for example, acetone, methyl ethyl ketone (MEK), or a combination thereof; the initiator is, for example, azobisisobutyronitrile (AIBN), dimethyl sulfoxide, dicumyl peroxide, benzoyl peroxide, or a combination thereof.

The primer composition provided by the disclosure and effect brought by the primer composition when being applied to the copper foil substrate are described in detail with reference to several experiments presented as follows. Although the following experiments are described, the materials used and the amount and ratio thereof, as well as process details and process flow, etc., can be suitably modified without exceeding the scope of the disclosure. Accordingly, restrictive interpretation should not be made to the disclosure based on the experiment described below.

Example 1

<Surface Modification to PTFE Prepreg>

A sodium etching solution is prepared first. After 300 ml of dimethyl ether (DME), 30 g of naphthalene, and 4.86 g of sodium are heated at 50° C. for 4 hours, the solution turns black.

PTFE emulsion (DuPont LX-30) is mixed with $SiO_2$ (US-silica, 25 µm), and $SiO_2$ accounts for 55% of the total weight. The PTFE prepreg is completed by rolling into a sheet by a roller and then sintering.

The PTFE prepreg is then soaked in the sodium etching solution for 10 seconds. Surfaces of the PTFE prepreg turn dark brown with free radical functional groups being disposed thereon.

<Copper Foil Glossy Surface Treatment>

A Fukuda Foil T9DA (½ Oz) is selected as the copper foil. Micro-etching is performed first on its glossy surface by using a hydrogen sulphate system, as such, a treated surface has a Rz of 1.0 µm and a Rq of 0.2 µm. Thereafter, the treated surface is sprayed with silane containing carbon-carbon double bonds (triethoxyvinylsilane) and then is baked in an oven (baked at 130° C. for 10 minutes).

<Primer Preparation>

Polybutadiene resin (10 g) (Polysciences, Inc., No. 480843, Mw 1,000 to 8,500), tetramethyl tetravinyl cyclotetrasiloxane (2.2 g), and azobisisobutyronitrile (AIBN)

(0.22 g) are dissolved in methyl ethyl ketone (MEK) (25 g) followed by heating to 70° C. for 2 hours. Next, dicumyl peroxide (0.22 g) is added. In this experiment, a molar ratio of polybutadiene resin (hydrocarbon resin) to tetramethyl tetravinyl cyclotetrasiloxane (a compound having three or more carbon-carbon double bonds) is 1:1.

<Pressing>

A surface of the PTFE prepreg treated with the sodium etching method is sprayed with the primer composition, baked to 160° C. for 3 minutes, and then stacked on the T9DA glossy-surfaced copper foil having the silane on the surface. Then, the other surface of the PTFE prepreg with no copper foil being stacked thereon is also sprayed with the primer composition, baked to 160° C. for 3 minutes, and stacked on the T9DA glossy-surfaced copper foil having the silane on the surface for thermal pressing. A substrate structure as shown in FIG. 2 is obtained.

A tensile test and an electrical property test are performed afterwards to the foregoing sample obtained, and results are shown in Table 1.

Example 2

The same preparation method used in Example 1 is adopted, but the time for soaking the PTFE prepreg in the sodium etching solution is changed to 30 seconds. Similarly, a tensile test and an electrical property test are performed to the sample obtained, and results are shown in Table 1.

Comparative Example 1

T9DA glossy-surfaced copper foil same as that of example 1 is adopted and is directly pressed with a PTFE prepreg at 180° C. The PTFE prepreg is not surface modified and is not sprayed with a primer. Similarly, a tensile test and an electrical property test are performed to the sample obtained, and results are shown in Table 1.

Comparative Example 2

T9DA glossy-surfaced copper foil having the silane on a surface same as that of example 1 is adopted, a PTFE prepreg is soaked in sodium etching solution for 30 seconds, and the treated PTFE prepreg (with no foregoing primer composition being sprayed on the surface) and the T9DA glossy-surfaced copper foil is thermally pressed at a pressing temperature of 180° C. Similarly, a tensile test and an electrical property test are performed to the sample obtained, and results are shown in Table 1 below.

TABLE 1

| | 10 GHz SPDR dielectric property test | | |
|---|---|---|---|
| | Tension (kg/cm) | Relative permittivity | Loss tangent |
| Comparative example 1 | 0 | 3.16 | 0.0014 |
| Comparative example 2 | 0 | 3.16 | 0.0018 |
| Example 1 | 0.7 | 3.15 | 0.0015 |
| Example 2 | 1.2 | 3.16 | 0.0018 |

It can be seen from FIG. 1 that the copper foil substrate without the primer fails the tension test.

In order to further verify influences brought by the primer on the dielectric property of the copper foil substrate, the following experiments are performed for comparison and verification.

Comparative Example 3

An electrical property test is directly performed to an untreated PTFE prepreg, and a result is shown in Table 2.

Comparative Example 4

The surface modification method used on the PTFE prepreg in example 1 is adopted. That is, a PTFE prepreg is soaked in the sodium etching solution for 30 seconds, and then an electrical property test is performed to the PTFE prepreg. A result is shown in Table 2.

Comparative Example 5

The surface modification method used on the PTFE prepreg in example 1 is adopted. That is, a PTFE prepreg is soaked in the sodium etching solution for 30 seconds. However, the surface of the PTFE prepreg being treated by the sodium etching method is sprayed with polybutadiene resin (PPB) as a primer and is baked to be cured.

An electrical property test is performed to the obtained sample containing the PTFE prepreg and the primer, and a result is shown in Table 2.

Examples 3 to 6

The method of comparative example 5 is adopted. That is, a surface of a PTFE prepreg is modified, but sprayed with a primer containing polybutadiene resin (PPB) and tetramethyl tetravinyl cyclotetrasiloxane (TMTVCS), wherein the molar ratio of PPB to TMTVCS in the primer is 1:10, 1:5, 1:1, and 1:0.2, respectively.

An electrical property test is performed to the respective samples obtained, and respective results are shown in Table 2.

Examples 7 to 9

The method of comparative example 5 is adopted. That is, a surface of a PTFE prepreg is modified, but the time for soaking the PTFE prepreg in the sodium etching solution is changed to 10 seconds. Then, the modified surface is sprayed with a primer containing polybutadiene resin (hydrocarbon resin) and tetramethyl tetravinyl cyclotetrasiloxane (a compound having three or more carbon-carbon double bonds), and the molar ratio of polybutadiene resin to tetramethyl tetravinyl cyclotetrasiloxane in the primer is 1:10, 1:5, and 1:1, respectively.

An electrical property test is performed to the respective samples obtained, and respective results are shown in Table 2.

TABLE 2

| | 10 GHz SPDR dielectric property test | |
|---|---|---|
| | Relative permittivity | Loss tangent |
| Comparative example 3 | 3.16 | 0.0014 |
| Comparative example 4 (sodium etching for 30 seconds) the copper foil on the substrate is removed in advance, and the PTFE prepreg is soaked in the sodium etching solution for 30 seconds | 3.16 | 0.0018 |
| Comparative example 5 (pure PPB) | 3.37 | 0.0027 |
| Example 3 (PPB:TMTVCS = 1:10) | 2.86 | 0.0030 |
| Example 4 (PPB:TMTVCS = 1:5) | 3.35 | 0.0020 |

TABLE 2-continued

| | 10 GHz SPDR dielectric property test | |
|---|---|---|
| | Relative permittivity | Loss tangent |
| Example 5 (PPB:TMTVCS = 1:1) | 3.24 | 0.0024 |
| Example 6 (PPB:TMTVCS = 1:0.2) | 3.29 | 0.0020 |
| the copper foil on the substrate is removed in advance, and the PTFE prepreg is soaked in the sodium etching solution for 10 seconds | | |
| Example 7 (PPB:TMTVCS = 1:10) | 2.83 | 0.0034 |
| Example 8 (PPB:TMTVCS = 1:5) | 3.10 | 0.0016 |
| Example 9 (PPB:TMTVCS = 1:1) | 3.15 | 0.0015 |

It can be seen from Table 2 that the electrical property performance of the PTFE having the primer provided by the disclosure is not significantly different from that of the PTFE without the primer of comparative examples 3 to 4, and thereby, the PTFE having the primer can be used for high-frequency transmission. As for the primer of comparative example 5, the primer cannot be bonded to the copper foil.

In view of the foregoing, in the embodiments of the disclosure, since the specific primer composition is used, high-frequency dielectric property is obtained while tensile strength of the substrate can be maintained. Further, favorable bonding effect can be achieved even if pressing without high temperatures.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A primer composition, comprising:
    a mixture of a hydrocarbon resin and a compound having three or more carbon-carbon double bonds, wherein a molar ratio of the hydrocarbon resin to the compound having three or more carbon-carbon double bonds is 1:0.2 to 1:10, wherein the compound having three or more carbon-carbon double bonds comprises methylvinyl cyclosiloxane, tetramethyl tetravinyl cyclotetrasiloxane, pentamethylpentavinyl cyclopentasiloxane, octavinylocta silasesquioxane, or a combination thereof, and
    wherein the hydrocarbon resin comprises polybutadiene, polyphenylene ether, or a combination thereof.

2. The primer composition as claimed in claim 1, wherein a weight average molecular weight of the polybutadiene is between 1,000 and 8,500.

3. The primer composition as claimed in claim 1, further comprising a ketone solvent and an initiator.

4. The primer composition as claimed in claim 3, wherein the ketone solvent comprises acetone, methyl ethyl ketone, or a combination thereof.

5. The primer composition as claimed in claim 3, wherein the initiator comprises azobisisobutyronitrile, dimethyl sulfoxide, dicumyl peroxide, benzoyl peroxide, or a combination thereof.

6. A copper foil substrate, comprising:
    copper foil;
    a fluorinated polymer layer, disposed on a surface of the copper foil;
    a silane layer, disposed between the fluorinated polymer layer and the surface of the copper foil; and
    a primer layer, disposed between the fluorinated polymer layer and the silane layer, wherein the primer layer comprises the primer composition as claimed in claim 1.

7. The copper foil substrate as claim in claim 6, wherein the surface of the copper foil has a ten-point mean roughness (Rz) of 2 μm or less and a root-mean-square roughness (Rq) of 0.5 μm or less.

8. The copper foil substrate as claim in claim 6, wherein a thickness of the fluorinated polymer layer is less than 1mm.

9. The copper foil substrate as claim in claim 6, wherein the fluorinated polymer layer comprises polytetrafluoroethylene (PTFE), fluorinated ethylene propylene (FEP), soluble polyfluoroalkoxy (PFA), or tetrachloroethylene/perfluoromethyl vinyl ether (MFA).

10. The copper foil substrate as claim in claim 6, wherein a thickness of the primer layer is less than 2.5 μm.

11. A copper foil substrate, comprising:
    first copper foil;
    second copper foil;
    a fluorinated polymer layer, disposed between the first copper foil and the second copper foil;
    a first silane layer, disposed between the fluorinated polymer layer and the first copper foil;
    a first primer layer, disposed between the fluorinated polymer layer and the first silane layer;
    a second silane layer, disposed between the fluorinated polymer layer and the second copper foil; and
    a second primer layer, disposed between the fluorinated polymer layer and the second silane layer, wherein the first primer layer and the second primer layer comprise the primer composition as claimed in claim 1.

* * * * *